(12) United States Patent
Ikeda

(10) Patent No.: US 8,254,499 B2
(45) Date of Patent: Aug. 28, 2012

(54) DIGITAL SATELLITE BROADCASTING RECEIVING TUNER AND SATELLITE BROADCASTING RECEIVING DEVICE INCLUDING THE SAME

(75) Inventor: Hitoshi Ikeda, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 979 days.

(21) Appl. No.: 12/256,975

(22) Filed: Oct. 23, 2008

(65) Prior Publication Data
US 2009/0110119 A1 Apr. 30, 2009

(30) Foreign Application Priority Data

Oct. 25, 2007 (JP) .................................. 2007-278138

(51) Int. Cl.
*H03D 3/22* (2006.01)
(52) U.S. Cl. ........ 375/332; 375/279; 375/316; 375/322; 375/329; 375/344
(58) Field of Classification Search .................. 375/229, 375/261, 279, 283, 308, 316, 322, 323, 329, 375/330, 332, 340, 347, 350
See application file for complete search history.

(56) References Cited

U.S. PATENT DOCUMENTS

| 6,067,332 | A | 5/2000 | Taura et al. | |
|---|---|---|---|---|
| 6,128,352 | A | 10/2000 | Maeda | |
| 7,477,707 | B2 * | 1/2009 | Kazi et al. | 375/330 |
| 7,660,373 | B2 * | 2/2010 | Jia et al. | 375/343 |
| 7,702,002 | B2 * | 4/2010 | Krasner | 375/150 |
| 8,041,321 | B1 * | 10/2011 | Shi et al. | 455/168.1 |
| 8,059,699 | B2 * | 11/2011 | Yeh et al. | 375/150 |
| 2008/0211715 | A1 * | 9/2008 | Feintuch et al. | 342/357.12 |
| 2009/0195452 | A1 * | 8/2009 | Mizuochi et al. | 342/357.15 |

FOREIGN PATENT DOCUMENTS

| JP | 6-85616 A | 3/1994 |
|---|---|---|
| JP | 10-145188 A | 5/1998 |
| JP | 10-313285 A | 11/1998 |

* cited by examiner

*Primary Examiner* — Hirdepal Singh
(74) *Attorney, Agent, or Firm* — Birch, Stewart, Kolasch & Birch, LLP

(57) ABSTRACT

When a satellite broadcasting receiving device 5 is initially set up, a receivable channel is searched for each satellite. In this search, a wider frequency acquisition range than a frequency acquisition range which is generally used is set for a QPSK demodulation IC 15, while the frequency of a PLL 9 is fixed. Then, in the wider frequency acquisition range, an offset is shifted by a frequency step Fstep' by using a function for setting a frequency offset, the function being included in the QPSK demodulation IC 15. Thus, a signal search is carried out throughout a reception frequency range.

13 Claims, 9 Drawing Sheets

DIGITAL SATELLITE BROADCASTING RECEIVING TUNER AND SATELLITE BROADCASTING RECEIVING DEVICE INCLUDING THE SAME

This Nonprovisional application claims priority under U.S.C. §119(a) on Patent Application No. 278138/2007 filed in Japan on Oct. 25, 2007, the entire contents of which are hereby incorporated by reference.

FIELD OF THE INVENTION

The present invention relates to a digital satellite broadcasting receiving tuner and a satellite broadcasting receiving device including the same.

BACKGROUND OF THE INVENTION

FIG. 8 is a block diagram illustrating a conventional digital satellite broadcasting system 101. A signal 102 transmitted from a satellite is received by a DISH antenna 103, and the frequency of the signal 102 thus received is converted by an LNB (Low Noise Block Converter) 104. The signal whose frequency has been thus converted is inputted to a satellite broadcasting receiving device 105. The satellite broadcasting receiving device 105 is, for example, a set top box (STB). An RF (Radio Frequency) signal 106 to be inputted to the satellite broadcasting receiving device 105 is firstly inputted to a tuner 107. Then, the signal level of the RF signal 106 is adjusted by an AMP 108 included in the tuner 107. The RF signal whose signal level has been thus adjusted is converted into a baseband signal by: a PLL (Phase-Locked Loop) 109 for outputting a signal having a local frequency F_lo; a 90-degree phase shifter 110 for shifting, by 90 degrees, the phase of a signal having a frequency F_lo; and a mixer 111 and a mixer 112 for mixing together (i) an RF signal whose signal level has been adjusted and (ii) a signal which has a frequency F_lo and whose phase has been shifted by 90 degrees. An LPF (Low Pass Filter) 113 and an LPF 114 remove, from the baseband signal, unwanted signal components outside a band. Then, the baseband signal is inputted to a QPSK (Quadrature Phase Shift Keying) demodulation section 116 included in a QPSK demodulation IC (Integrated Circuit) 115. The QPSK demodulation IC 115 is connected to an oscillator 127. The oscillator 127 provides the QPSK demodulation IC 115 with a standard frequency. Generally, the oscillator 127 is a crystal oscillator.

Generally, tuning to a desired signal is carried out as follows. A CPU (Central Processing Unit) 119, which is mounted in an MPEG (Moving Picture Expert Group) demodulation IC 118 included in a backend decoder 117, controls the QPSK demodulation IC 115. As a result, a PLL control signal 120 is transmitted, based on tuning information requested by a user, to a PLL 109 via the QPSK demodulation section 116. Then, tuning frequency information is set. The LPF 113 outputs a baseband signal (I signal) 121, and the LPF 114 outputs a baseband signal (Q signal) 122. Then, the baseband signal (I signal) 121 and the baseband signal (Q signal) 122 thus outputted are inputted to the QPSK demodulation section 116. After that, the baseband signal (I signal) 121 and the baseband signal (Q signal) 122 are subjected to digital demodulation, in response to a QPSK demodulation section control signal 123 transmitted from the backend decoder 117. Then, the signal thus obtained is outputted as a TS (Transport Stream) signal 124. The TS signal 124 is demodulated into a video/audio signal 125 by the MPEG demodulation IC 118.

In order to receive a signal, it is necessary to control the tuner 107 and the QPSK demodulation section 116 in accordance with the conditions of the signal to be received. A signal is received by (i) setting a tuning frequency and (ii) carrying out a signal search by the QPSK demodulation section 116. The tuner 107 and the QPSK demodulation section 116 are controlled by the CPU 119 mounted in the backend decoder 117. A control program to be used is the one which is stored in advance in: a memory 126 externally provided to the MPEG demodulation IC 118; or the like.

FIG. 9 is a schematic view of an RF signal to be inputted to the tuner. The horizontal axis represents a frequency. Within the frequency range (from 950 MHz to 2150 MHz) in which the tuner receives a signal, a signal TP (transponder) which has been subjected to QPSK modulation exists in accordance with a frequency table defined for each satellite. A symbol rate of each TP has a value within the range from 1 Msps to 45 Msps, according to the specification.

In regard to reception of a signal of satellite broadcasting, the following case may occur. Even from a single satellite, the number of TP signals which are receivable are different between the reception areas because every reception area has different conditions for a signal due to geographical factors and the like. In view of this, when an antenna and a tuner each of which is included in a digital satellite broadcasting system are initially set up, it is necessary to check, for each satellite, which channel can be received, that is, to carry out an automatic search. When a user watches and listens to a program, a channel is selected in accordance with the information obtained as a result of the automatic search.

The automatic search is carried out as illustrated in FIG. 10. That is, firstly a tuning frequency is set at the lower limit Fmin (950 MHz) of a reception frequency range. Then, the QPSK demodulation section 116 carries out a signal search around the tuning frequency which is thus set. The QPSK demodulation section 116 carries out demodulation by carrying out the signal search and reproducing a QPSK signal. The QPSK signal to be reproduced exists within a frequency acquisition range (±Fqpsk/2) for QPSK demodulation, which frequency acquisition range is set in advance. Also, the QPSK signal to be reproduced has a certain center frequency and a certain symbol rate.

The frequency acquisition range for the QPSK demodulation is generally set to a range of approximately ±5 MHz. This range is set in consideration of the following. The frequency of a signal (C-Band: 4 GHz to 8 GHz/Ku-band: 12 GHz to 18 GHz) transmitted from a satellite is down-converted by the LNB 104 so as to be within a reception range (950 MHz to 2150 MHz) of the tuner, the LNB 104 being mounted to the DISH antenna 103 for receiving the signal. At this time, a change in an outside temperature or the like may cause a drift in a local oscillation frequency F_lnb_lo, which is used by the LNB 104 during the down-converting. This causes an offset in the frequency to be inputted to the tuner after the conversion. Considering the assumed amount of the offset frequency, the frequency acquisition range for the QPSK demodulation is set to a range of approximately ±5 MHz.

Generally, in view of a functional capability of the QPSK demodulation section 116, it is possible to set a range wider than the above-mentioned frequency acquisition range. For example, a frequency acquisition range of the QPSK demodulation section 116, which is currently mounted in the QPSK demodulation IC 115 as a tuner, is ±Fmclk/2=100 MHz, that is, Fmclk=100 MHz, according to the specification. This means that the QPSK demodulation section 116 has the frequency acquisition range of ±50 MHz.

However, in an actual signal search, if the frequency acquisition range is set so as to be too wide, such a problem may occur that another TP signal adjacent to a TP signal which is to be acquired is acquired accidentally.

Furthermore, in a case where the frequency acquisition range is set so as to be wide, a problem may occur especially when a signal having a low symbol rate is received. The problem is as follows: (i) after conversion, a too large offset occurs in a frequency to be inputted to the tuner; and (ii) the signal having the low symbol rate cannot be locked properly. That is, it is possible to lock such a signal more surely with a frequency acquisition range which is limited in advance, compared to a case with a wide frequency acquisition range.

As described above, the frequency acquisition range for the QPSK demodulation is set so as to be narrower than a frequency acquisition range in which the QPSK demodulation section 116 actually can acquire a signal. When a signal exists within the frequency acquisition range for the QPSK demodulation, a reception signal is demodulated by the signal search carried out by the QPSK demodulation section.

The automatic search is carried out by judging whether or not a reception signal can be locked within the frequency range (from 950 MHz to 2150 MHz) of a signal that the tuner receives. That is, the automatic search is carried out such that: (i) a tuning frequency is set at Fmin; (ii) a signal search is carried out within the tuning frequency thus set; and (iii) the tuning frequency is shifted by a certain frequency step Fstep. For example, in FIG. 10, tuning to a frequency F101 within a frequency range RANGE 101 is carried out, and then a signal search is carried out with the range of the RANGE 101 set as the frequency acquisition range for the QPSK demodulation. At this time, a center frequency of a signal TP 101 exists within the frequency range RANGE 101. Therefore, the signal TP 101 is locked. Then, program information and the like in the signal TP 101 are read out and stored in a memory.

Next, in order to carry out the signal search within a frequency range RANGE 102, the tuning frequency is shifted by the frequency step Fstep, so that tuning to a frequency F102 is carried out. Then, in a similar manner as described above, the signal search is carried out, within the frequency range RANGE 102, around the tuned frequency F102 which is thus tuned. At this time, no signal exists within the frequency range RANGE 102. Therefore, tuning to a frequency F103 is subsequently carried out, and then the signal search is carried out within a frequency range RANGE 103. As such, the tuning and the signal search are repeatedly carried out until the signal search (i.e., sweeping) is carried out at the upper limit Fmax (2150 MHz) of a reception signal frequency range.

As well as the conventional digital satellite broadcasting system 101, there is a device for searching for a channel or broadcasting as disclosed in Japanese Unexamined Patent Application Publication, Tokukaihei, No. 6-85616 (published on Mar. 25, 1994). The device disclosed is a tuning device which carries out automatic preset by automatically searching for all channels and thereby increases an operation speed of the automatic preset carried out for all channels. Also, Japanese Unexamined Patent Application Publication, Tokukaihei, No. 10-145188 (published on May 29, 1998) discloses a receiving device which reduces the time taken for a channel search. Further, Japanese Unexamined Patent Application Publication, Tokukaihei, No. 10-313285 (published on Nov. 24, 1998) discloses a digital audio broadcasting receiving device which surely searches for receivable broadcasting and reduces the time taken for this process.

With the arrangement described above, the conventional digital satellite broadcasting system 101 carries out a signal search, within a reception frequency range, for every predetermined frequency step Fstep. In this case, however, every time tuning is carried out for each frequency step, it is necessary to ensure wait time for stabilizing a tuning PLL. The wait time is generally set at approximately 100 ms.

For example, such a case may be considered that a signal search is carried out, with Fstep=2 MHz, within a frequency range (from 950 MHz to 2150 MHz) of a signal that a tuner receives. In this case, the wait time is expressed as follows:

$$(2150-950)/2*100=60000 \text{ [ms]} ≈ 60 \text{ seconds}$$

That is, the order of one minute is spent as the wait time. Generally, the time taken for an automatic search is approximately five minutes. In a case where the wait time is the order of one minute, the wait time accounts for approximately 20% of the time taken for the automatic search. As such, the wait time is longer than the time taken for other operation in the automatic search. Thus, the conventional digital satellite broadcasting system 101 has such a problem that it takes much time for an automatic search.

SUMMARY OF THE INVENTION

The present invention was made in view of the foregoing problems, and an object of the present invention is to provide a digital satellite broadcasting receiving tuner which reduces the time taken for an automatic search in a satellite broadcasting receiving device.

A satellite broadcasting receiving tuner of the present invention includes: a QPSK demodulation IC for demodulating a baseband signal into a digital signal; and automatic search means for carrying out an automatic search when a satellite broadcasting receiving device is initially set up, in which automatic search a receivable channel is searched for each satellite, the automatic search means including: (i) frequency acquisition range setting means for setting, for the QPSK demodulation IC, frequency acquisition ranges respectively to wider frequency acquisition ranges than a frequency acquisition range which is generally used, while a frequency of a tuning PLL is fixed; (ii) signal search start frequency setting means for setting, within the wider frequency acquisition ranges, a signal search start frequency at which the QPSK demodulation IC starts a signal search; and (iii) signal search means for carrying out the signal search while the signal search start frequency is shifted by a certain frequency step.

With this invention, the QPSK demodulation IC includes a function for setting (a) the wider frequency acquisition ranges than the frequency acquisition range which is generally used and (b) an offset in the signal search start frequency.

The signal search in a reception frequency range is carried out such that the value of the offset is shifted by a predetermined frequency step, by using the function for setting the offset in the signal search start frequency in the QPSK demodulation IC.

In the wider frequency acquisition ranges, the signal search is generally started at the center of the frequency acquisition ranges, and is carried out within a frequency range which is set in advance. On the other hand, the QPSK demodulation IC can set a signal search start frequency arbitrarily. This function and the wider frequency acquisition ranges are utilized to the fullest extent, so that the signal search is carried out throughout the respective frequency acquisition ranges while the signal search start frequency is shifted by a predetermined step.

Thus, the present invention allows a signal search to be carried out by mainly utilizing the wider frequency acquisition ranges, while the frequency of the tuning PLL is fixed. This makes it possible to reduce the number of times that the tuning PLL carries out tuning, thereby reducing the wait time required for fixing the frequency of the tuning PLL. This allows a reduction in the time taken for an automatic search.

DESCRIPTION OF THE EMBODIMENTS

First Embodiment

The following describes, with reference to FIG. 1 to FIG. 7, one embodiment of the present invention.

Figure 1:
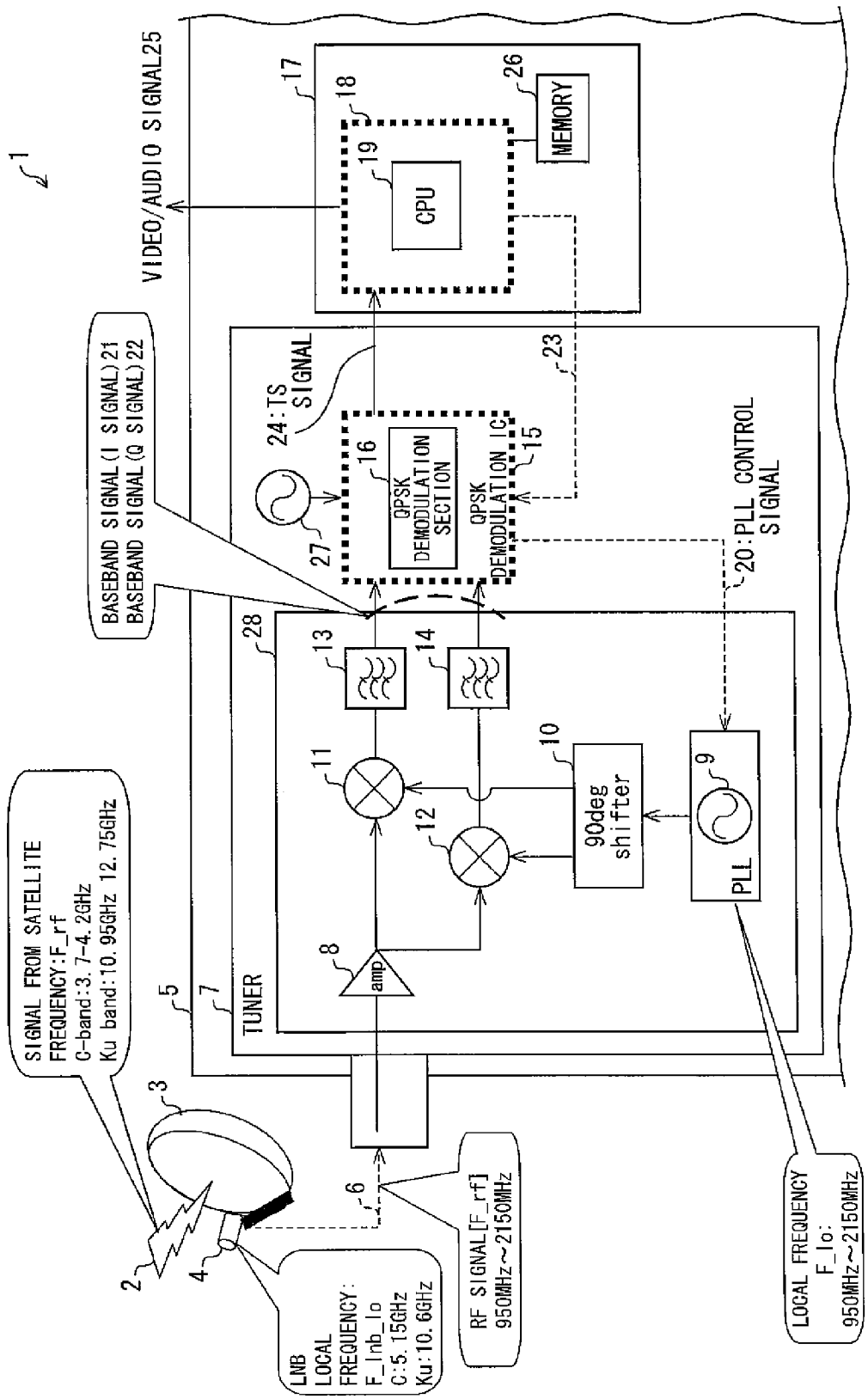
FIG. 1 is a block diagram illustrating a digital satellite broadcasting system of one embodiment of the present invention.

FIG. 1 is a block diagram illustrating a digital satellite broadcasting system 1 according to the present invention. A signal 2 transmitted from a satellite is received by a DISH antenna 3, and the frequency of the signal 2 thus received is converted by an LNB (Low Noise Block Converter) 4. The signal whose frequency has been thus converted is inputted to a satellite broadcasting receiving device 5. The satellite broadcasting receiving device 5 is, for example, a set top box (STB).

An RF signal 6 to be inputted to the satellite broadcasting receiving device 5 is inputted to a tuner 7. Then, the signal level of the RF signal 6 is adjusted by an AMP 8 included in the tuner 7. The RF signal whose signal level has been thus adjusted is converted into a baseband signal by: a PLL 9 for outputting a signal having a local frequency F_lo; a 90-degree phase shifter 10 for shifting, by 90 degrees, the phase of a signal having a frequency F_lo; and a mixer 11 and a mixer 12 for mixing together (i) an RF signal whose signal level has been adjusted and (ii) a signal which has a frequency F_lo and whose phase has been shifted by 90 degrees.

An LPF (Low-Pass Filter) 13 and an LPF 14 remove, from the baseband signal, unwanted signal components outside a band. Then, the baseband signal is inputted to a QPSK demodulation section 16 included in a QPSK demodulation IC 15. The QPSK demodulation IC 15 is connected to an oscillator 27. The oscillator 27 provides the QPSK demodulation IC 15 with a standard frequency. Generally, the oscillator 27 is a crystal oscillator.

Tuning to a desired signal is generally carried out as follows. A CPU 19, which is mounted in an MPEG demodulation IC 18 included in a backend decoder 17, controls the QPSK demodulation IC 15. As a result, a PLL control signal 20 is transmitted, based on tuning information requested by a user, to a PLL 9 via the QPSK demodulation section 16. Then, tuning frequency information is set.

The LPF 13 outputs a baseband signal (I signal) 21, and the LPF 14 outputs a baseband signal (Q signal) 22. Then, the baseband signal (I signal) 21 and the baseband signal (Q signal) 22 thus outputted are inputted to the QPSK demodulation section 16. After that, the baseband signal (I signal) 21 and the baseband signal (Q signal) 22 are subjected to digital demodulation, in response to a QPSK demodulation section control signal 23 transmitted from the backend decoder 17. Then, the signal thus obtained is outputted as a TS (Transport Stream) signal 24. The TS signal 24 is demodulated into a video/audio signal 25 by the MPEG demodulation IC 18.

Figure 2:
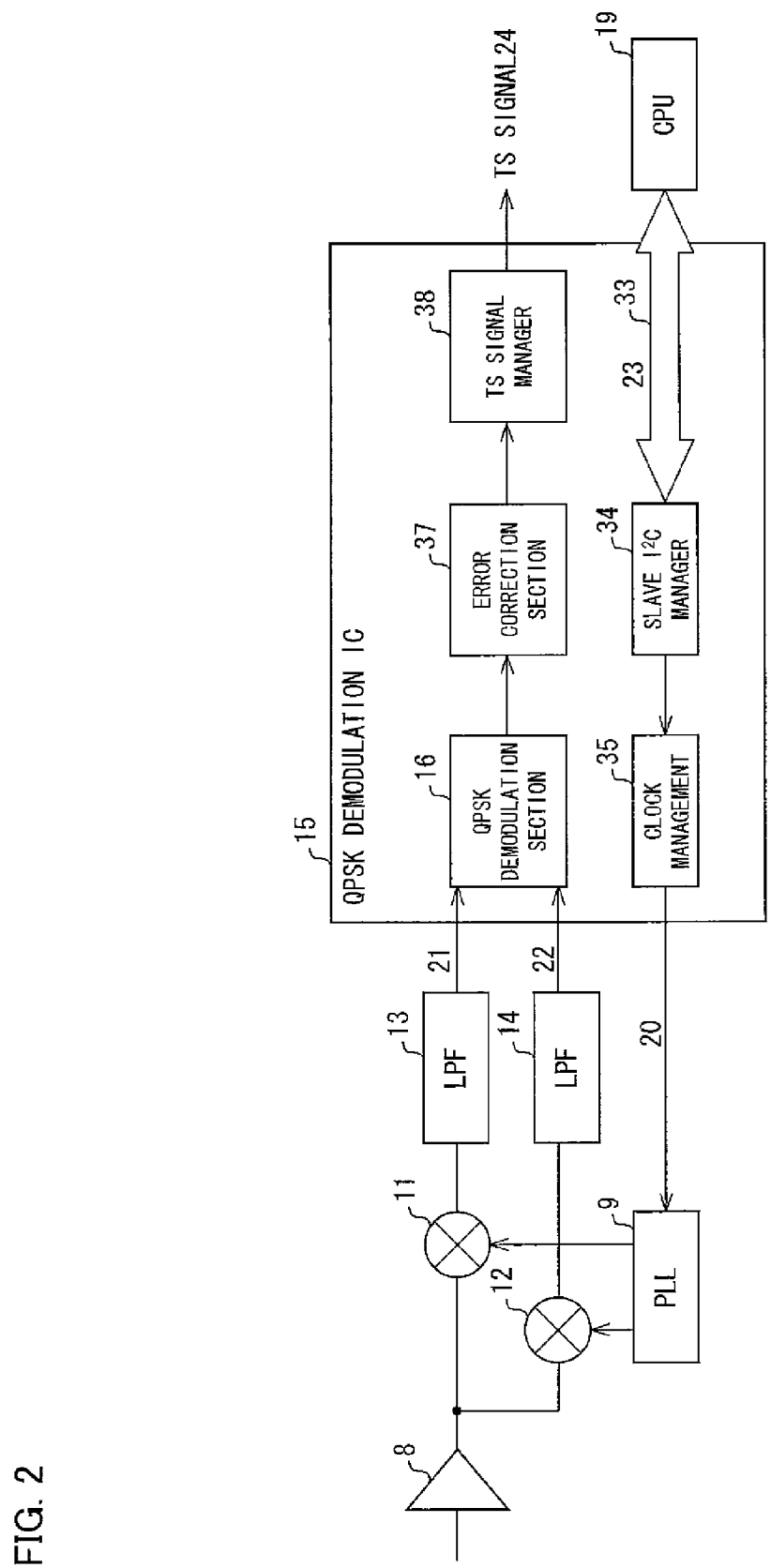
FIG. 2 is a block diagram illustrating an arrangement of the inside of a QPSK demodulation IC.

FIG. 2 is a block diagram illustrating an arrangement of the inside of the QPSK demodulation IC 15. The CPU 19 transmits the QPSK demodulation section control signal 23 via a signal line 33. Then, the PLL control signal 20 is transmitted to the PLL 9 via a slave I²C manager 34 and a clock management 35 inside the QPSK demodulation IC 15. The signal line 33 includes a signal line SCL and a signal line SDA.

After the baseband signal (I signal) 21 and the baseband signal (Q signal) 22 are outputted from the LPF 13 and the LPF 14, respectively, the baseband signal (I signal) 21 and the baseband signal (Q signal) 22 are demodulated by a QPSK demodulation section 16. Then, the signal thus obtained is outputted, as a TS signal 24, to the outside of the QPSK demodulation IC 15 via an error correction section 37 and a TS signal manager 38. The error correction section 37 carries out processes such as a decoding process by using a Reed-Solomon code and a deinterleaving process.

In order to receive a signal, it is necessary to control the tuner 7 and the QPSK demodulation section 16 in accordance with the conditions of the signal to be received. A signal is received by (i) setting a tuning frequency and (ii) carrying out a signal search by the QPSK demodulation section 16. The tuner 7 and the QPSK demodulation section 16 are controlled by the CPU 19 mounted in the backend decoder 17. A control program to be used is the one which is stored in advance in: a memory 26 externally provided to the MPEG demodulation IC 18; or the like.

Figure 3:
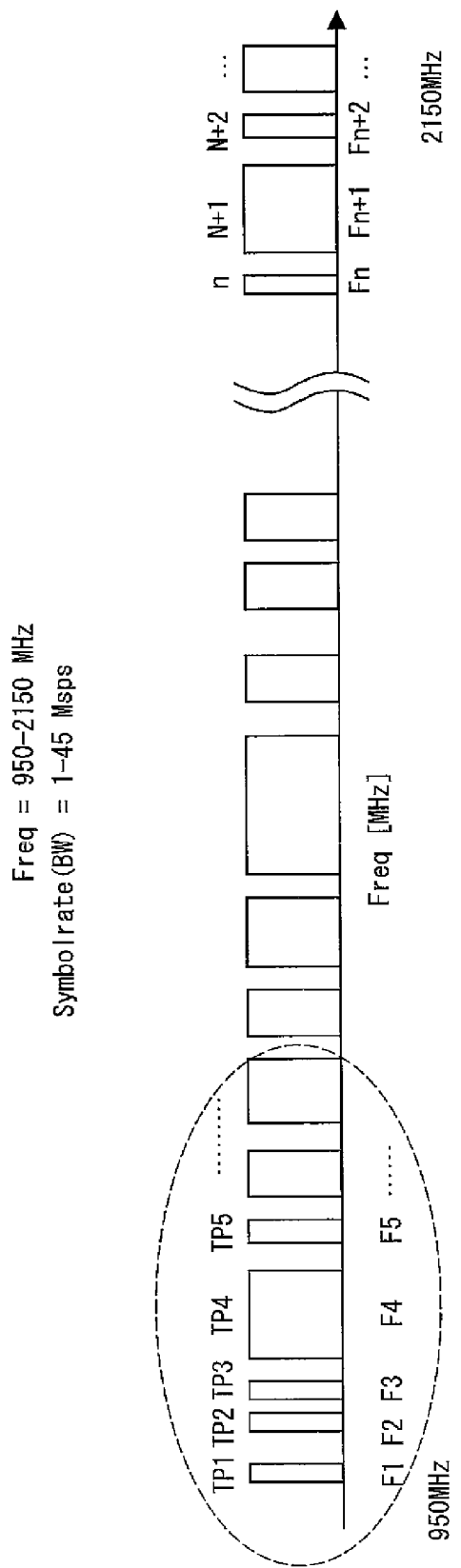
FIG. 3 is a schematic view of an RF signal to be inputted to a tuner included in the digital satellite broadcasting system of one embodiment of the present invention.

FIG. 3 is a schematic view of an RF signal to be inputted to the tuner. The horizontal axis represents a frequency. Within the frequency range (from 950 MHz to 2150 MHz) in which the tuner receives a signal, a signal TP (transponder) which has been subjected to QPSK modulation exists in accordance with a frequency table defined for each satellite. A symbol rate of each TP has a value within the range from 1 Msps to 45 Msps, according to the specification.

In regard to reception of a signal of satellite broadcasting, the following case may occur. Even from a single satellite, the number of TP signals which are receivable are different between the reception areas because every reception area has different conditions for a signal due to geographical factors and the like. In view of this, when an antenna and a tuner each of which is included in a digital satellite broadcasting system are initially set up, it is necessary to check, for each satellite, which channel can be received, that is, to carry out an automatic search. When a user watches and listens to a program, a channel is selected in accordance with the information obtained as a result of the automatic search.

A frequency acquisition range for QPSK demodulation is generally set to a range of approximately ±5 MHz. This range is set in consideration of the following. The frequency of a signal (C-Band: 4 GHz to 8 GHz/Ku-band: 12 GHz to 18 GHz) transmitted from a satellite is down-converted by the LNB 4 so as to be within a reception range (950 MHz to 2150 MHz) of a tuner, the LNB 4 being mounted to the DISH antenna 3 for receiving the signal. At this time, a change in an outside temperature or the like may cause a drift in a local oscillation frequency $F\_lnb\_lo$, which is used by the LNB 4 during the down-converting. This causes an offset in the frequency to be inputted to the tuner after the conversion. Considering the assumed amount of the offset frequency, the frequency acquisition range for the QPSK demodulation is set to a range of approximately ±5 MHz.

Generally, in view of a functional capability of the QPSK demodulation section 16, it is possible to set a range wider than the above-mentioned frequency acquisition range. For example, a frequency acquisition range of the QPSK demodulation section 16, which is currently mounted in the QPSK demodulation IC 15 as a tuner, is ±Fmclk/2=100 MHz, that is, Fmclk=100 MHz, according to the specification. This means that the QPSK demodulation section 16 has the frequency acquisition range of ±50 MHz.

Figure 4:
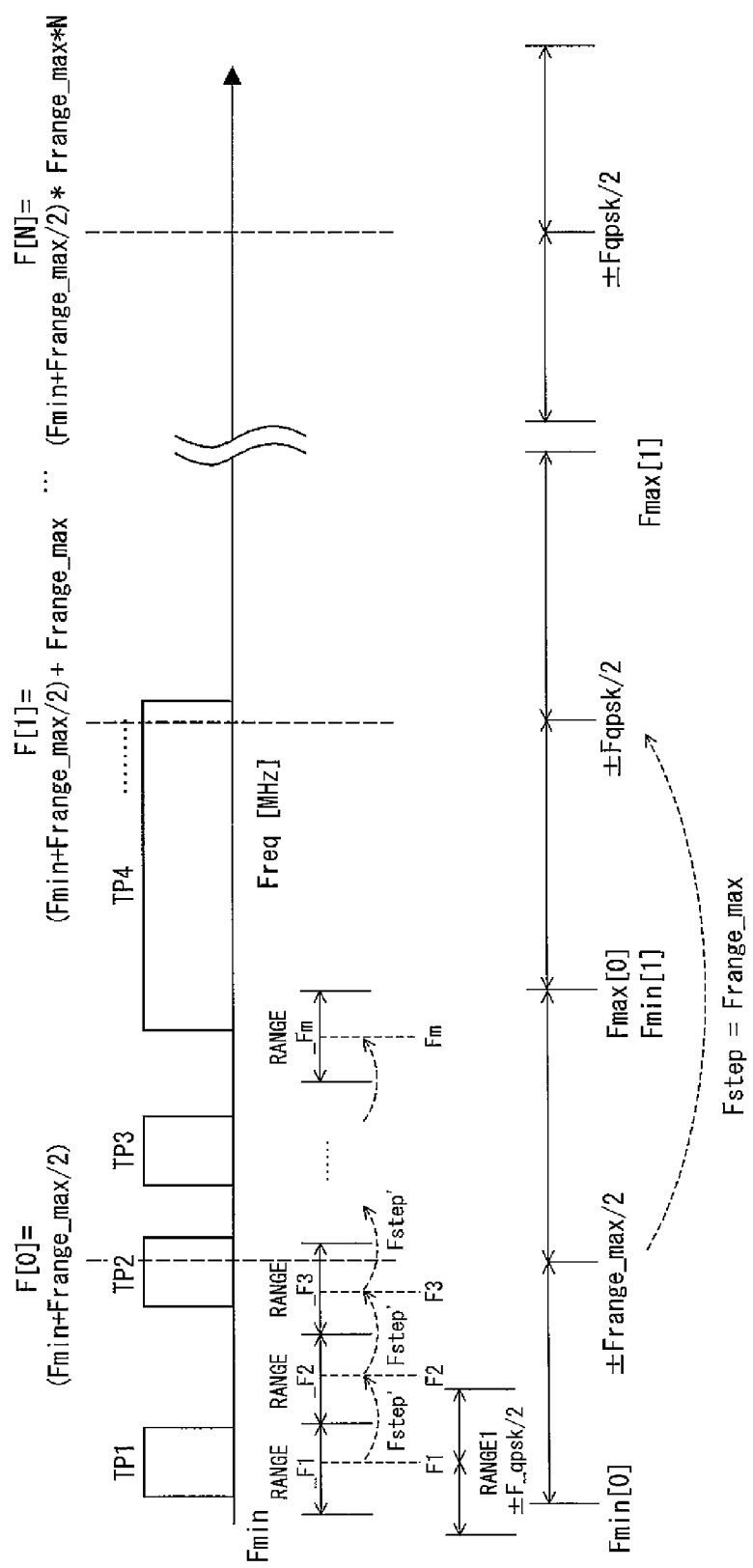
FIG. 4 is a schematic view of a frequency of the RF signal, and is a view illustrating that the RF signal is received through an automatic search carried out by the digital satellite broadcasting system of the present invention.

FIG. 4 illustrates how the digital satellite broadcasting system 1 carries out an automatic search.

In FIG. 4 illustrating a schematic view of the frequency of an RF signal, the lower limit Fmin of a reception frequency range is 950 MHz, the upper limit Fmax of the reception frequency range is 2150 MHz, and a frequency acquisition range of a QPSK demodulation section is ±Fqpsk_max/2. A signal search is carried out within the frequency range (from 950 MHz to 2150 MHz) of a signal that the tuner receives. The signal search is carried out while the QPSK demodulation section 16 shifts a signal search start frequency by a frequency step Fstep'. Further, a tuning frequency, that is, the center of the frequency acquisition range of the QPSK demodulation section is denoted as F[N], the lower limit of the frequency acquisition range of the QPSK demodulation section is denoted as Fmin[N], and the upper limit of the frequency acquisition range of the QPSK demodulation section is denoted as Fmax[N] (N=0, 1, . . . ).

The following describes a specific method for carrying out the foregoing signal search. The QPSK demodulation IC 15, which carries out QPSK demodulation, is provided with a register. A register value is obtained in accordance with a calculating formula, the register value being equal to a designated signal search start frequency. Then, the register value thus obtained is written into the register of the QPSK demodulation IC 15. Generally, writing the register value into the register causes the signal search to start. Also, providing the register with another setting can define a frequency range for the signal search carried out around the signal search start frequency.

The following description deals with, as an example, a case where a signal search is firstly carried out in the frequency range which corresponds to the lower limit Fmin of the reception frequency range. In order to carry out the signal search, tuning to a tuning frequency F[0]=Fmin+Frange_max/2 is carried out. Next, a signal search start frequency is set at a center frequency F1 within a frequency acquisition range RANGE_F1. Along with this, a signal search range RANGE 1 is set to a range of ±F_qpsk/2 centering around the center frequency F1.

After the signal search in the signal search range RANGE 1 is completed, the signal search start frequency is shifted by +Fstep' from the center frequency F1 so as to be set at a center frequency F2. Then, the signal search is carried out around the center frequency F2, in a range of ±F_qpsk/2, as well as in the signal search in the signal search range RANGE 1. As such, the signal search is repeatedly carried out, and the signal search start frequency is shifted by the frequency step Fstep' each time. The signal search is repeatedly carried out until it reaches a frequency acquisition range RANGE_Fm. At this point, the signal search range reaches the upper limit Fmax[0] of the frequency acquisition range. This means the completion of the signal search in the frequency acquisition range, centering around the center frequency F[0], from the lower limit Fmin[0] of the frequency acquisition range to the upper limit Fmax[0] of the frequency acquisition range.

Next, in order to carry out the signal search in a subsequent frequency acquisition range, tuning to a tuning frequency F[1] is carried out. The tuning frequency F[1] is expressed by F[1]=F[0]+Fstep, in consideration of its frequency acquisition range (the frequency step Fstep=Frange_max).

In the subsequent frequency acquisition range, the signal search is carried out, in a similar manner as for the frequency F[0], from the frequency acquisition range RANGE_F1 to the frequency acquisition range RANGE_Fm, while the signal search start frequency is shifted by the frequency step Fstep' from the center frequency F1 to the center frequency Fm.

The foregoing signal search is repeatedly carried out until it reaches a signal search range which corresponds to a tuning frequency F[N]=Fmin+Frange_max*N, at which the frequency acquisition range reaches the upper limit Fmax=2150 MHz of the reception frequency range. This allows the signal search to be carried out in the reception frequency range from the lower limit Fmin=950 MHz of the reception frequency range to the upper limit Fmax=2150 MHz of the reception frequency range.

Generally, in the tuner 7, the following process is carried out: (i) the baseband signal (I signal) 21 and the baseband signal (Q signal) 22 each of which is to be inputted to the QPSK demodulation section 16 are limited in their bands by the LPF 13 and the LPF 14 in a tuner front end 28; and (ii) thereby unwanted high frequency components are removed from the baseband signal (I signal) 21 and the baseband signal (Q signal) 22. Generally, the bandwidths of the LPF 13 and the LPF 14 are changeable so as to be adjusted in accordance with the bandwidth of a reception signal. However, in a case of an automatic search, it is necessary to set the bandwidths of the LPF 13 and the LPF 14 to be as wide as possible, because the conditions (e.g., a signal frequency and a bandwidth) of a reception signal are unknown.

The following describes the bandwidths of the LPF 13 and the LPF 14. The signal band ranges from 1 Msps to 45 Msps, according to the specification. That is, the LPF 13 and the LPF 14 do not need to receive a signal exceeding 45 Msps. Therefore, according to the specification, the maximum bandwidth of the tuner front end 28 is generally set to an LPF bandwidth around BW_MAX=45 Msps×α, which is a bandwidth required for receiving the signal having the signal band from 1 Msps to 45 Msps. The "α" herein means a roll-off factor, and the value of "α" herein is 1.35.

Figure 5:
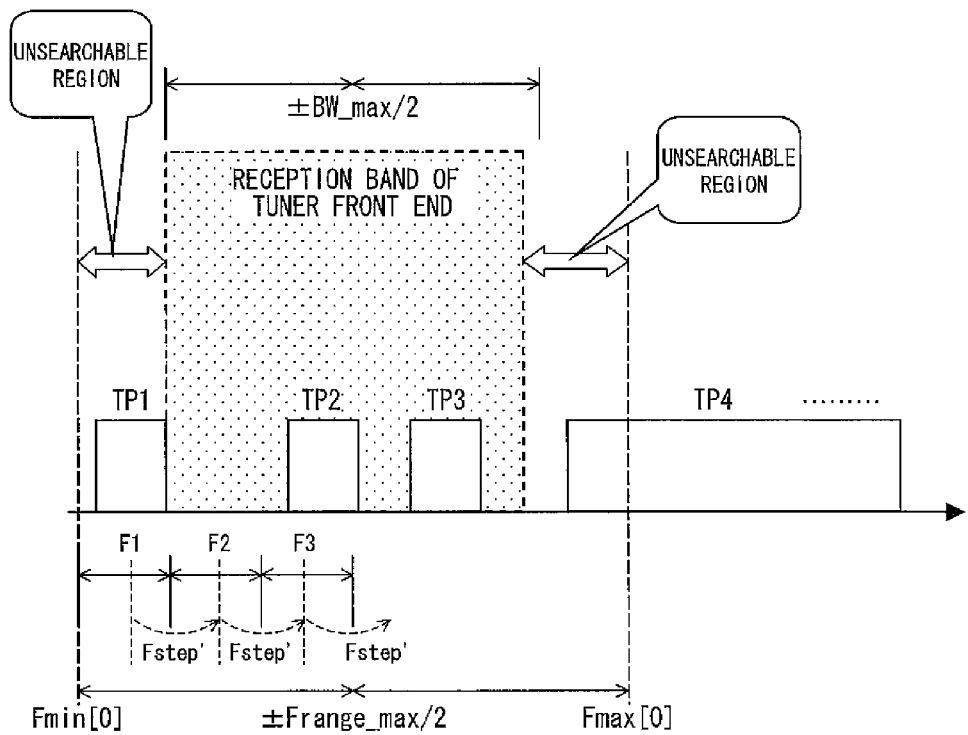
FIG. 5 is a view illustrating a state where a reception band of a tuner front end is set.

Therefore, as illustrated in FIG. 5, although the QPSK demodulation IC 15 is capable to acquire a signal in the frequency acquisition range of approximately ±50 MHz, the signal search cannot actually be carried out in the range outside the range of ±BW_MAX/2 (z approximately ±30 MHz) due to the limitation by the LPF 13 and the LPF 14 in the tuner front end 28.

In order to avoid the effects caused by this, such a mode is prepared that the bandwidths of the LPF 13 and the LPF 14 are set to infinity. This makes it possible to carry out an effective signal search which allows to utilize a frequency acquisition range of the QPSK demodulation IC 15 to the fullest extent.

Generally, the tuner front end 28 and the QPSK demodulation section 16 are separately arranged in different blocks or as different ICs. In this case, in order to switch between an automatic search and a normal search, the QPSK demodulation section 16 is required to transmit a command to the tuner front end 28 so that the mode of the bandwidths of the LPF 13 and the LPF 14 switches one from another. On the other hand, integrating the tuner front end 28 into the QPSK demodulation section 16 makes it possible to carry out the process integrally.

The following description deals with a case where the LPF 13 and the LPF 14 are included in the tuner front end 28.

Figure 6:
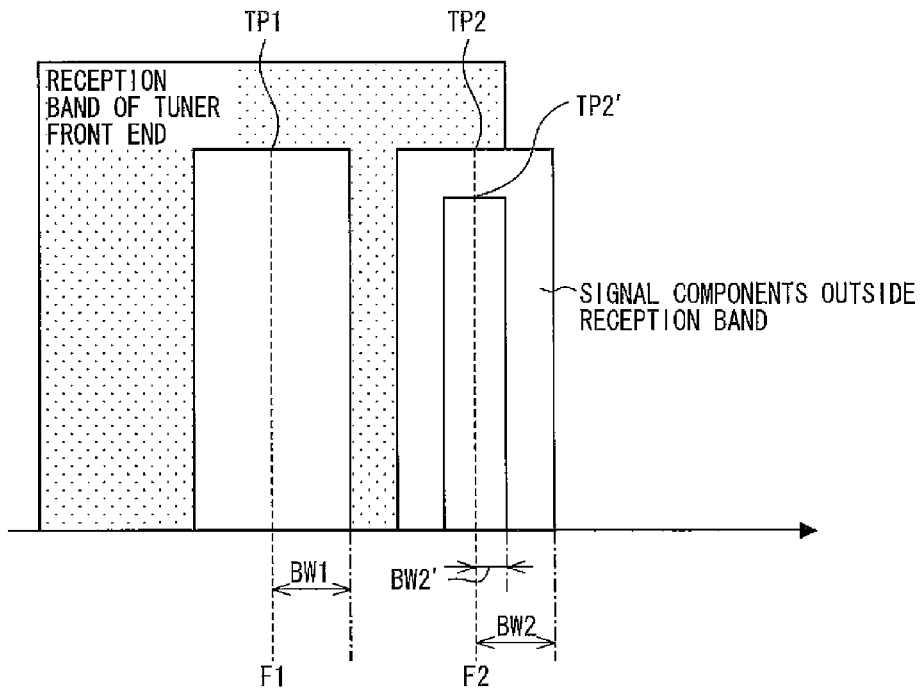
FIG. 6 is a view illustrating a state where a reception band of the tuner front end is set.

For example, assuming that the reception band of the tuner front end 28 is set as illustrated in FIG. 6, a signal TP1 existing at a center frequency F1 can be received without any troubles. This is because that the signal TP1 is completely within the reception band.

Next, the following deals with reception of a signal TP2. Although the signal TP2 has the same signal band as the signal TP1 has, the signal TP2 exists at a frequency of F2 and therefore some of its signal components are outside the reception band. This causes degradation of reception performance when the signal TP2 is actually received.

On the other hand, although a signal TP2' exists at the center frequency F2, the degradation of the reception performance does not occur in the signal TP2'. This is because the signal band of the signal TP2' is narrow.

As described above, in a case where the LPF 13 and the LPF 14 are provided in the tuner front end 28, the following problem may be assumed: A signal which exists within a reception band and is close to an edge of the reception band has a part of its signal components outside the reception band, so that its reception performance is degraded. In a signal search, it is necessary to more strictly limit a bandwidth of a signal which is received, as the signal gets closer to an edge of a reception range.

Therefore, in a case where a signal search is carried out in a frequency acquisition range whose reception band is limited, such a function is provided that the function changes the maximum value of the bandwidth of a signal which is received, in accordance with the position of a frequency where the signal search is carried out. The bandwidth of the signal which is received is changed by the QPSK demodulation section 16.

If some signal components of a signal cannot be searched for around an edge of the reception range because the signal has a wide band, the current signal search range is overlapped with a subsequent signal search range when the reception range is shifted to the subsequent area.

Figure 7:
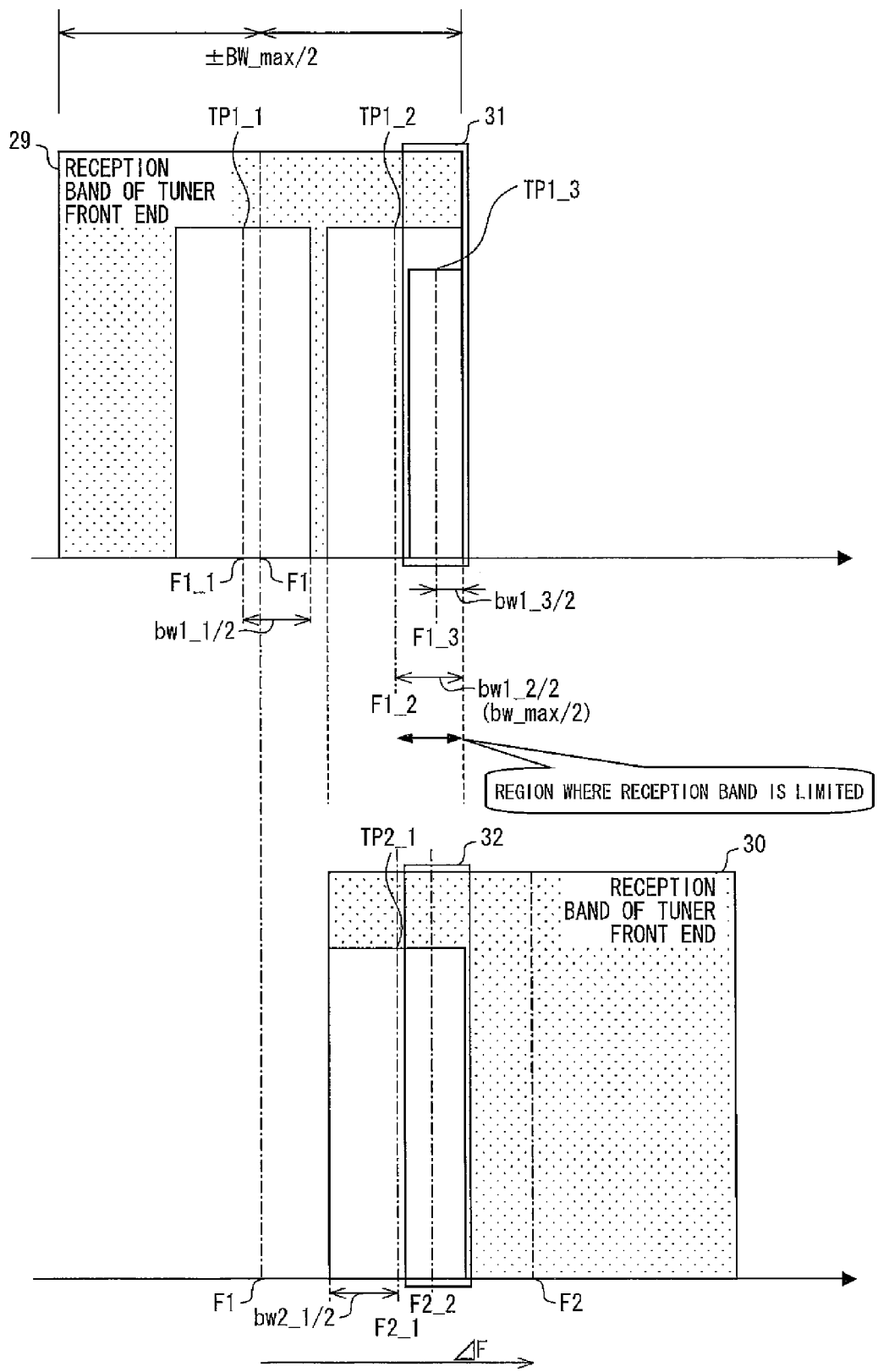
FIG. 7 is a view illustrating how a signal search is carried out in a state where one signal search range is overlapped with another signal search range.
Figure 8:
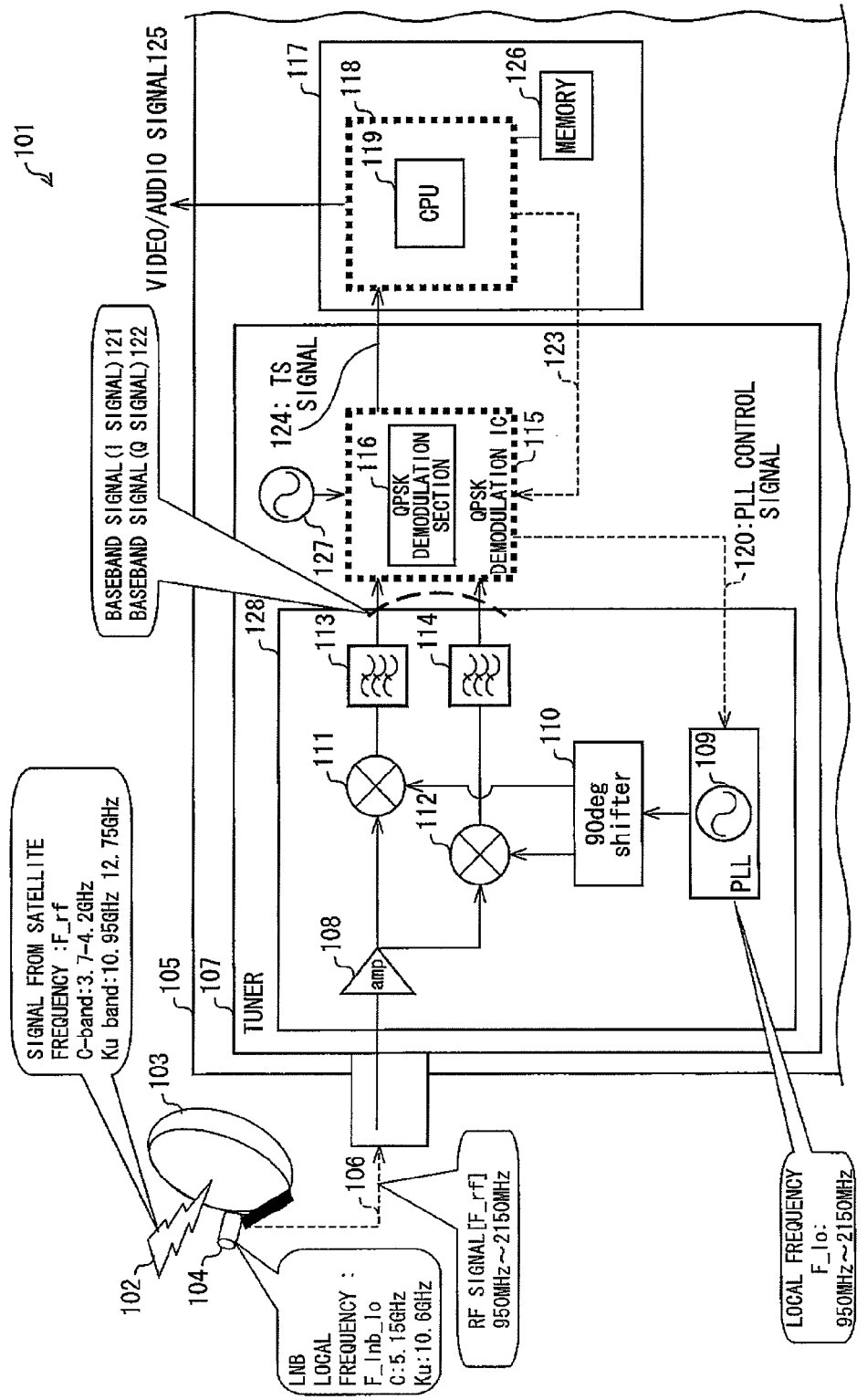
FIG. 8 is a block diagram illustrating a conventional digital satellite broadcasting system.
Figure 9:
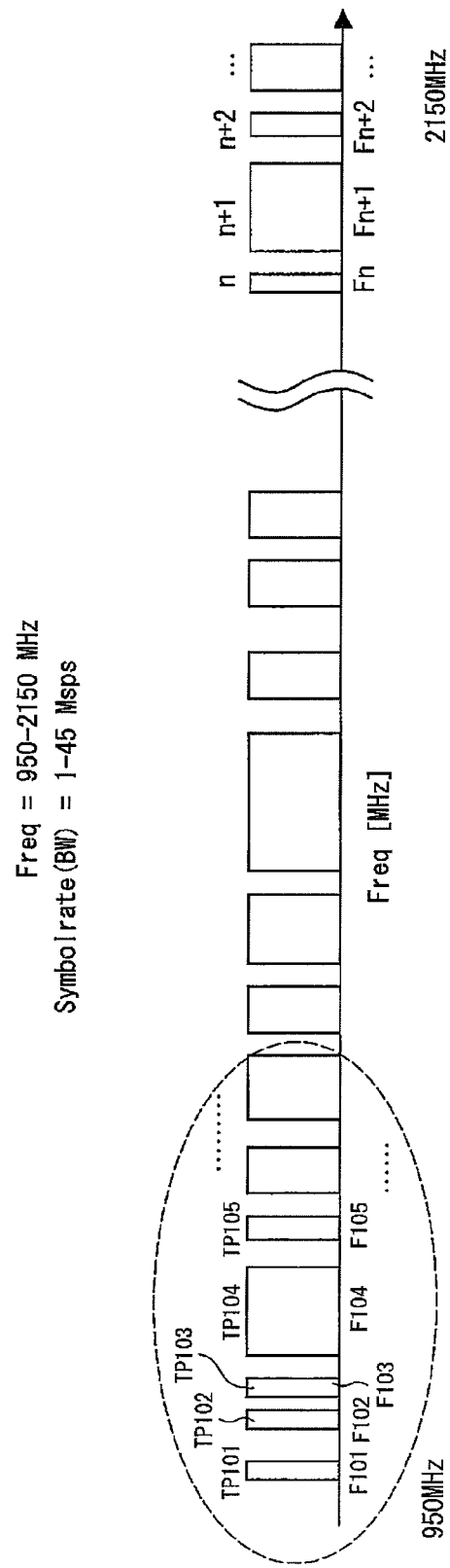
FIG. 9 is a schematic view of an RF signal to be inputted to a tuner included in the conventional digital satellite broadcasting system.
Figure 10:
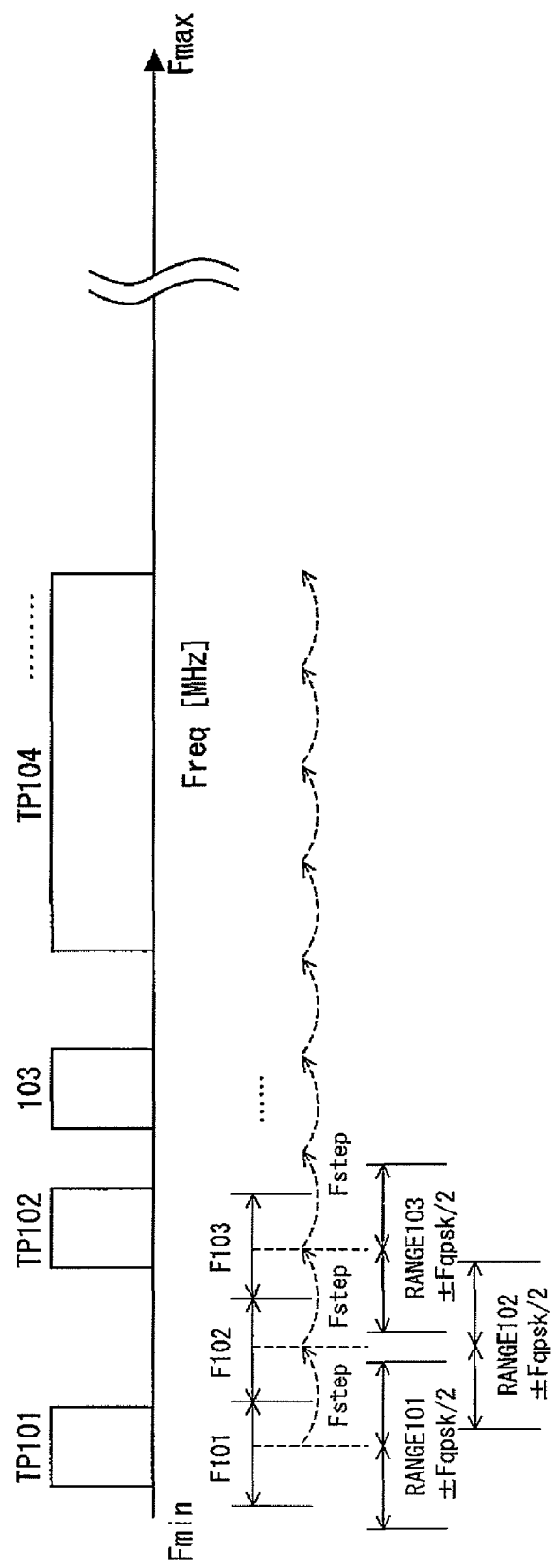
FIG. 10 is a view illustrating that the RF signal is received through an automatic search carried out by the conventional digital satellite broadcasting system.

FIG. 7 illustrates a signal search in a range where one signal search range is overlapped with another signal search range. A reception band 29 illustrated in FIG. 7 is the reception band of the tuner front end 28. In the reception band 29, the signal band of a signal TP1_1 is bw_MAX=45 Msps, which is the maximum value of the predetermined signal band. In this case, all signal components of the signal TP1_1 are within the reception band 29. As is clear from this, at a center frequency F1_1 of the signal TP1_1, it is possible to receive a signal having the predetermined signal band (i.e., from 1 Msps to 45 Msps).

The limit of the frequency in the reception band 29 at which frequency a signal having the signal band bw_MAX can be received without any troubles is the position of a signal TP1_2. At the position of the signal TP1_2, the right edge of the signal band coincides with the right edge of the reception band. That is, the right edge of the signal TP1_2 having the signal band bw1_2=45 Msps coincides with the right edge of the reception region 29. In a case where a center frequency exists in a region on the right side of the center frequency F1_2, a signal having a wide band will have its signal components outside the reception band 29. Therefore, when a signal search is carried out in this region, the reception performance is degraded. For this reason, in a region 31 on the right side of the center frequency F1_2, reception of a signal having a wide band is limited. Therefore, a signal search in this region should be carried out, as illustrated in FIG. 7, in consideration of a distance bw1_3/2 between a center frequency F1_3 of the signal TP1_3 and the right edge of the reception band 29. That is, in this case, the signal search should be carried out such that only a signal (e.g., a signal TP1_3) having a signal band narrower than the distance bw1_3/2 is received.

If a signal having a wide band cannot be searched for because reception of a signal is limited in the right part of the reception band 29, such a signal is searched for in a reception band (i.e., a reception band 30, which is a reception band of the tuner front end 28) where the signal search is subsequently carried out. In the reception band 30, the signal search for a signal having a narrow band has been already completed. Therefore, for the signal search in the reception band 30, the QPSK demodulation section 16 provides such a setting that a signal having a band wider than a predetermined band is searched for.

A tuning frequency is shifted by ΔF, from the center frequency F1 of the reception band 29 to the center frequency F2 of the reception band 30. The "ΔF" is expressed by the following formula:

$$\Delta F = BW\_MAX - bw\_MAX$$

The "BW_MAX" herein represents a reception range of a tuner, and the "bw_MAX" herein represents a maximum value of a signal band. In this embodiment, bw_MAX=45 Msps.

In the reception band 30, the signal search is carried out in a region around a center frequency F2_1, which corresponds to the center frequency F1_2. The center frequency F1_2 is a frequency at which reception of a signal is started to be limited in the reception band 29. When the signal search was carried out in the reception band 29, the signal search in a signal band around the center frequency F1_2 was carried out except for the signal band bw_MAX. Therefore, in the signal search for the center frequency F2_1, the signal search only needs to be carried out in the signal band bw_MAX. Similarly, in a region where the reception band 29 is overlapped with the reception band 30, the signal search for a signal having a narrow signal band has been already done. That is, in a higher-frequency part in a reception band, the possibility becomes higher that the signal search has not completed yet. A band where the signal search has not been completed yet is supplementarily subjected to the signal search in a region 32.

A center frequency F2_2 in the region 32 corresponds to the center frequency F1_3 in the region 31. In a case where a signal search is carried out around the center frequency F2_2 in the region 32, the signal search in the region 32 only needs to be carried out for a signal having a signal band wider than a signal band bw1_3. This is because that the signal search for a signal having a signal band narrower than the signal band bw1_3 has been already done in the region 31.

This process is repeatedly carried out. After a signal search is completed in a part where one signal search range is overlapped with another signal search range, a signal search is subsequently carried out for a signal having a normal signal band from 1 Msps to 45 Msps, in a region where a signal band is not limited.

In a part where one signal search range is overlapped with another signal search range, a signal search is carried out with the signal band limited. Generally, it takes longer time to carry out a signal search for a signal having a narrow signal band, compared with a case where a signal having a wide signal band is searched for. The signal band in which the signal search is carried out is divided into parts, and the parts thus divided are allocated to regions, respectively. This prevents repetition of a search for a signal having a narrow signal band, thereby allowing an effective signal search. This reduces the time taken for an automatic search.

The process described above is generally carried out by software included in the CPU 19 in the backend decoder 17. However, integrating, into the QPSK demodulation IC 15, a function for carrying out an automatic search reduces load on the CPU 19.

Also, integrating, with the MPEG demodulation IC 18, the QPSK demodulation IC 15 including the function for carrying out the automatic search allows an effective process and a reduction in the size of an IC.

A satellite broadcasting receiving device including a digital satellite broadcasting receiving tuner having the foregoing function can reduce the time taken for an automatic search, compared with a conventional one.

Also, for example, assuming that the lower limit Fmin of a reception frequency range is 950 MHz, the upper limit Fmax of the reception frequency range is 2150 MHz, and the frequency acquisition range Frange_max is +50 MHz (=100 MHz), the total wait time in tuning to a frequency is expressed as follows:

$$(F\text{max} - F\text{min})/F\text{range\_max} * 100 \text{ [ms]} =$$
$$(2150 - 950 \text{ [MHz]})/50 \text{ [MHz]} * 100 \text{ [ms]} = 2400 \text{ [ms]} = 2.4 \text{ seconds}$$

As is clear from this, the wait time is significantly reduced, compared with the wait time of a conventional one, that is, 60 seconds.

Thus, while maintaining a frequency of the PLL 9 fixed, the satellite broadcasting receiving device 5 carries out a signal search by mainly utilizing a frequency acquisition range of the QPSK demodulation IC 15 which frequency acquisition range is wider than the frequency acquisition range generally used. This makes it possible to reduce the number of times that the PLL 9 carries out tuning, thereby reducing the wait time required for fixing the frequency of the PLL 9. This allows a reduction in the time taken for an automatic search.

Summery of Embodiment

A satellite broadcasting receiving tuner according to the present embodiment includes: a QPSK demodulation IC 15 for demodulating a baseband signal into a digital signal; and automatic search means for carrying out an automatic search when a satellite broadcasting receiving device 5 is initially set up, in which automatic search a receivable channel is searched for each satellite, the automatic search means including: (i) frequency acquisition range setting means for setting, for the QPSK demodulation IC 15, frequency acquisition ranges respectively to wider frequency acquisition ranges than a frequency acquisition range which is generally used, while a frequency of a PLL 9 is fixed; (ii) signal search start frequency setting means for setting, within the wider frequency acquisition ranges, a signal search start frequency at which the QPSK demodulation IC 15 starts a signal search; and (iii) signal search means for carrying out the signal search while the signal search start frequency is shifted by a certain frequency step.

With this invention, the QPSK demodulation IC 15 includes a function for setting (a) the wider frequency acquisition ranges than the frequency acquisition range which is generally used and (b) an offset in the signal search start frequency.

The signal search in a reception frequency range is not carried out by shifting a tuning frequency. Instead, the signal search in the reception frequency range is carried out such that: the function for setting the offset in the signal search start frequency is used; and thereby the value of the offset is shifted by a frequency step Fstep' in the QPSK demodulation IC 15.

In the wider frequency acquisition ranges, the signal search is generally started at the center of the frequency acquisition ranges, and is carried out within a frequency range which is set in advance. On the other hand, the QPSK demodulation IC 15 can set a signal search start frequency arbitrarily. This function and the wider frequency acquisition ranges are utilized to the fullest extent, so that the signal search is carried out throughout the respective frequency acquisition ranges while the signal search start frequency is shifted by a predetermined step.

Thus, the present invention allows a signal search to be carried out by mainly utilizing the wider frequency acquisition ranges, while the frequency of the PLL 9 is fixed. This makes it possible to reduce the number of times that the PLL 9 carries out tuning, thereby reducing the wait time required for fixing the frequency of the PLL 9. This allows a reduction in the time taken for an automatic search.

In the satellite broadcasting receiving tuner, the automatic search means may shift the frequency of the PLL 9 for the respective frequency acquisition ranges, set by the frequency acquisition range setting means, of the QPSK demodulation IC 15 so as to carry out the signal search throughout a reception frequency range.

According to this, the signal search throughout the reception frequency range is carried out as follows: (i) firstly the signal search is carried out in one of the wider frequency acquisition ranges; and (ii) after the signal search is completed in the one of the wider frequency acquisition ranges, the tuning frequency is shifted. The tuning frequency is shifted by the frequency step Fstep', and the shifting may be carried out by shifting the one of the wider frequency acquisition ranges by a frequency that the offset function sets.

As described above, in an automatic search, a signal search may be carried out in a reception frequency range by using (a) actual shifting of a tuning frequency, in combination with (b) shifting of a signal search start frequency carried out by the offset setting function of the QPSK demodulation IC 15. This makes it possible to reduce the number of times that tuning is carried out.

The reduction in the number of times that tuning is carried out can reduce the wait time in tuning. This makes it possible to reduce the time taken for an automatic search.

In the satellite broadcasting receiving tuner, the frequency acquisition range setting means may set a frequency shift range, in which the frequency of the PLL 9 is shifted, so that the frequency shift range is narrower than the frequency acquisition ranges of the QPSK demodulation IC 15; and the automatic search means may include region overlapping means for providing a region where the frequency shift range overlaps with the frequency acquisition ranges of the QPSK demodulation IC 15, the region being a maximum reception range of the frequency acquisition ranges of the QPSK demodulation IC 15.

With this, the signal band in which the signal search is carried out is divided into parts, and the parts thus divided are allocated to regions, respectively. This prevents repetition of a search for a signal having a narrow band, thereby allowing an effective signal search.

In the satellite broadcasting receiving tuner, the automatic search means may include signal bandwidth setting means for arbitrarily setting a range of a bandwidth of a signal that a QPSK demodulation section 16 receives.

With this, in a case where the signal search is carried out in the region where the frequency shift range overlaps with the frequency acquisition ranges of the QPSK demodulation IC 15, the signal conditions in the signal search in the frequency shift range are different from those in the frequency acquisition ranges of the QPSK demodulation IC 15. The signal band in which the signal search is carried out is divided into parts, and the parts thus divided are allocated to regions, respectively. This prevents repetition of a search for a signal having a narrow band, thereby allowing an effective signal search.

In the satellite broadcasting receiving tuner, the automatic search means may include bandwidth setting means for setting a bandwidth of a bandpass filter in a tuner front end 28 so that the bandwidth is wider than the frequency acquisition ranges of the QPSK demodulation IC 15; and the automatic search means carries out the automatic search in a state where the frequency acquisition ranges of the QPSK demodulation IC 15 are widened.

This makes it possible to utilize the frequency acquisition ranges of the QPSK demodulation IC 15 to the fullest extent, thereby allowing an effective signal search.

In the satellite broadcasting receiving tuner, the QPSK demodulation IC 15 may include any of each means described above.

This allows an effective signal search and a reduction in the number of times that tuning is carried out, thereby reducing the wait time in tuning. This makes it possible to reduce the time taken for an automatic search.

The satellite broadcasting receiving tuner may include an MPEG demodulation IC 18 for demodulating, into a recording signal, a digital demodulated signal outputted from the QPSK demodulation IC 15, the MPEG demodulation IC 18 being arranged so as to include each of the means.

This makes it possible to integrate, with the MPEG demodulation IC 18, the QPSK demodulation IC 15 including the means for carrying out an automatic search, thereby allowing an effective process and a reduction in the size of the IC.

A satellite broadcasting receiving device according to the present invention includes any of the satellite broadcasting receiving tuners described above. Therefore, the satellite broadcasting receiving device according to the present invention can reduce the time taken for an automatic search.

The present invention is not limited to the description of the embodiments above, but may be altered by a skilled person within the scope of the claims. An embodiment based on a proper combination of technical means disclosed in different embodiments is encompassed in the technical scope of the present invention.

What is claimed is:

1. A satellite broadcasting receiving tuner, comprising:
 a QPSK demodulation IC for demodulating a baseband signal into a digital signal; and
 an automatic search unit configured to carry out an automatic search when a satellite broadcasting receiving device is initially set up, in the automatic search a receivable channel is searched for each satellite,
 the automatic search unit including:
  a frequency acquisition range setting unit configured to set, for the QPSK demodulation IC, frequency acquisition ranges respectively to wider frequency acquisition ranges than a frequency acquisition range which is generally used, while a frequency of a tuning PLL is fixed;
  a signal search start frequency setting unit configured to set, within the wider frequency acquisition ranges, a signal search start frequency at which the QPSK demodulation IC starts a signal search; and
  a signal search unit configured to carry out the signal search while the signal search start frequency is shifted by a certain frequency step, wherein
 the automatic search unit shifts the frequency of the tuning PLL for the respective frequency acquisition ranges, set by the frequency acquisition range setting unit, of the QPSK demodulation IC so as to carry out the signal search throughout a reception frequency range.

2. The satellite broadcasting receiving tuner as set forth in claim 1, wherein:
 the frequency acquisition range setting unit sets a frequency shift range, in which the frequency of the tuning PLL is shifted, so that the frequency shift range is narrower than the frequency acquisition ranges of the QPSK demodulation IC; and
 the automatic search unit includes a region overlapping unit configured to provide a region where the frequency shift range overlaps with the frequency acquisition ranges of the QPSK demodulation IC, the region being a maximum reception range of the frequency acquisition ranges of the QPSK demodulation IC.

3. The satellite broadcasting receiving tuner as set forth in claim 2, wherein:
 the automatic search unit includes a signal bandwidth setting unit configured to arbitrarily set a range of a bandwidth of a signal that a QPSK demodulation section receives.

4. The satellite broadcasting receiving tuner as set forth in claim 3, wherein:
 the QPSK demodulation IC is arranged so as to include each of the units.

5. The satellite broadcasting receiving tuner as set forth in claim 3, further comprising an MPEG demodulation IC for demodulating, into a recording signal, a digital demodulated signal outputted from the QPSK demodulation IC,
 the MPEG demodulation IC being arranged so as to include each of the units.

6. The satellite broadcasting receiving tuner as set forth in claim 1, wherein:
 the automatic search unit includes a bandwidth setting unit configured to set a bandwidth of a bandpass filter in a tuner RF section so that the bandwidth is wider than the frequency acquisition ranges of the QPSK demodulation IC; and
 the automatic search unit carries out the automatic search in a state where the frequency acquisition ranges of the QPSK demodulation IC are widened.

7. The satellite broadcasting receiving tuner as set forth in claim 6, wherein:
the QPSK demodulation IC is arranged so as to include each of the units.

8. The satellite broadcasting receiving tuner as set forth in claim 6, further comprising an MPEG demodulation IC for demodulating, into a recording signal, a digital demodulated signal outputted from the QPSK demodulation IC,
the MPEG demodulation IC being arranged so as to include each of the units.

9. A satellite broadcasting receiving device, comprising a satellite broadcasting receiving tuner as set forth in claim 1.

10. A satellite broadcasting receiving tuner, comprising:
a QPSK demodulation IC for demodulating a baseband signal into a digital signal; and
an automatic search unit configured to carry out an automatic search when a satellite broadcasting receiving device is initially set up, in which automatic search a receivable channel is searched for each satellite,
the automatic search unit including:
a frequency acquisition range setting unit configured to set, for the QPSK demodulation IC, frequency acquisition ranges respectively to wider frequency acquisition ranges than a frequency acquisition range which is generally used, while a frequency of a tuning PLL is fixed;
a signal search start frequency setting unit configured to set, within the wider frequency acquisition ranges, a signal search start frequency at which the QPSK demodulation IC starts a signal search; and
a signal search unit configured to carry out the signal search while the signal search start frequency is shifted by a certain frequency step, wherein
the automatic search unit includes a bandwidth setting unit configured to set a bandwidth of a bandpass filter in a tuner RF section so that the bandwidth is wider than the frequency acquisition ranges of the QPSK demodulation IC; and
the automatic search unit carries out the automatic search in a state where the frequency acquisition ranges of the QPSK demodulation IC are widened.

11. The satellite broadcasting receiving tuner as set forth in claim 10, wherein:
the QPSK demodulation IC is arranged so as to include each of the units.

12. The satellite broadcasting receiving tuner as set forth in claim 10, further comprising an MPEG demodulation IC for demodulating, into a recording signal, a digital demodulated signal outputted from the QPSK demodulation IC,
the MPEG demodulation IC being arranged so as to include each of the units.

13. A satellite broadcasting receiving device, comprising a satellite broadcasting receiving tuner as set forth in claim 10.

* * * * *